US012777904B2

(12) United States Patent
Chen et al.

(10) Patent No.: US 12,777,904 B2
(45) Date of Patent: Oct. 27, 2026

(54) SUBSTRATE MANUFACTURING METHOD FOR AN EMBEDDED SUBSTRATE HAVING A DEVICE ADHERING AREA

(71) Applicant: Zhuhai ACCESS Semiconductor Co., LTD., Zhuhai City (CN)

(72) Inventors: Xianming Chen, Zhuhai City (CN); Gao Huang, Zhuhai City (CN); Wenjian Lin, Zhuhai City (CN); Yejie Hong, Zhuhai City (CN); Benxia Huang, Zhuhai City (CN); Juchen Huang, Zhuhai City (CN)

(73) Assignee: Zhuhai ACCESS Semiconductor Co., LTD., Zhuhai City (CN)

( * ) Notice: Subject to any disclaimer, the term of this patent is extended or adjusted under 35 U.S.C. 154(b) by 340 days.

(21) Appl. No.: 18/454,022

(22) Filed: Aug. 22, 2023

(65) Prior Publication Data

US 2024/0153819 A1 May 9, 2024

(30) Foreign Application Priority Data

Nov. 8, 2022 (CN) ......................... 202211389985.2

(51) Int. Cl.
*H10W 20/00* (2026.01)
*H10W 70/04* (2026.01)
(Continued)

(52) U.S. Cl.
CPC ........ *H10W 20/063* (2026.01); *H10W 70/042* (2026.01); *H10W 70/68* (2026.01); *H10W 70/69* (2026.01)

(58) Field of Classification Search
CPC ........... H01L 21/76885; H01L 21/4828; H01L 23/13; H01L 23/14; H01L 23/49822;
(Continued)

(56) References Cited

U.S. PATENT DOCUMENTS

2003/0011059 A1* 1/2003 Akram ................ H01L 23/3114 257/784
2012/0243192 A1* 9/2012 Robert ................ H01L 23/3735 361/767

(Continued)

FOREIGN PATENT DOCUMENTS

CN 102263077 A 11/2011
CN 207852653 U 9/2018

(Continued)

OTHER PUBLICATIONS

First Office Action and Search Report for Taiwanese Patent Application No. 112128759, mailed Mar. 28, 2024, 17 pages with English translation.

(Continued)

*Primary Examiner* — Wael M Fahmy
*Assistant Examiner* — Tiberiu Dan Onuta
(74) *Attorney, Agent, or Firm* — Buchalter; Jason W. Croft

(57) ABSTRACT

A substrate manufacturing method, an embedded substrate and a semiconductor are disclosed. The method includes: manufacturing a first semi-finished substrate including first circuit layers and a first dielectric layer arranged in staggered and laminated manner; arranging a viscous material layer on the first circuit layer to form a device adhering area; adhering an embedded device on the device adhering area, a pin face of the embedded device facing away from the viscous material layer; laminating a second dielectric layer on the first circuit layer, which covers the viscous material layer and the embedded device; manufacturing a first conductive pillar, a second conductive pillar and a second circuit layer, the first conductive pillar extending through the second dielectric layer and configured for connecting the second circuit layer with the first circuit layer, the second (Continued)

conductive pillar being configured for connecting the embedded device with the second circuit layer.

10 Claims, 3 Drawing Sheets

(51) Int. Cl.
*H10W 70/68* (2026.01)
*H10W 70/69* (2026.01)

(58) Field of Classification Search
CPC ............ H01L 23/5389; H01L 23/3121; H05K 3/4626; H05K 3/0047; H05K 3/0094; H05K 3/06; H05K 1/0271; H05K 1/185
See application file for complete search history.

(56) References Cited

U.S. PATENT DOCUMENTS

| | | | | |
|---|---|---|---|---|
| 2013/0026632 | A1 | 1/2013 | Kikuchi | |
| 2013/0249075 | A1 * | 9/2013 | Tateiwa | H05K 1/185 257/734 |
| 2021/0057384 | A1 * | 2/2021 | Kao | H10P 72/74 |
| 2021/0183783 | A1 * | 6/2021 | Park | H10W 70/611 |
| 2021/0305192 | A1 * | 9/2021 | Chu | H10P 72/74 |
| 2022/0310547 | A1 * | 9/2022 | Morita | H01L 24/29 |
| 2023/0369263 | A1 * | 11/2023 | Chuang | H01L 24/20 |
| 2024/0145337 | A1 * | 5/2024 | Sinha | H01L 23/3736 |

FOREIGN PATENT DOCUMENTS

| | | | |
|---|---|---|---|
| CN | 114567975 | A | 5/2022 |
| CN | 114666995 | A | 6/2022 |
| CN | 114724964 | A | 7/2022 |
| JP | 2014131040 | A | 7/2014 |
| JP | 2018195742 | A | 12/2018 |
| JP | 2019186256 | A | 10/2019 |
| JP | 2022120812 | A | 8/2022 |
| KR | 20220113274 | A | 8/2022 |
| TW | 202232712 | A | 8/2022 |
| WO | 2014188493 | A1 | 11/2014 |

OTHER PUBLICATIONS

First Office Action for Korean Patent Application No. 10-2023-0124751, mailed Nov. 26, 2024, 19 pages with English translation.
Decision to Grant a Patent for Japanese Patent Application No. 2023-134289, mailed Nov. 18, 2025, 5 pages with English translation.
First Office Action for Japanese Patent Application No. 2023-134289, mailed Oct. 8, 2024, 10 pages with English translation.
Second Office Action for Japanese Patent Application No. 2023-134289, mailed May 13, 2025, 10 pages with English translation.
The State Intellectual Property Office of People's Republic of China. First Search Report for CN Application No. 2022113899852 and English translation, mailed Jul. 22, 2026.
The State Intellectual Property Office of People's Republic of China. First Office Action for CN Application No. 2022113899852 and English translation, mailed Jul. 27, 2026.

* cited by examiner

SUBSTRATE MANUFACTURING METHOD FOR AN EMBEDDED SUBSTRATE HAVING A DEVICE ADHERING AREA

CROSS-REFERENCE TO RELATED APPLICATION

This application is based on and claims the benefit of priority from Chinese Patent Application No. 2022113899852, filed on 18 Nov. 2022, the entirety of which is incorporated by reference herein.

TECHNICAL FIELD

The disclosure relates to the technical field of semiconductor manufacturing, and is particularly a substrate manufacturing method, an embedded substrate and a semiconductor package.

BACKGROUND

With the continuous development of electronic industry, the multifunction and miniaturization of electronic products have become development trends. In the field of packaging substrates, embedding devices into a substrate may be conductive to achieving requirements for high integration, multifunction and miniaturization of the electronic products. In the existing technology, for manufacturing a substrate with an embedded device, a cavity is generally manufactured in the substrate first, and then a device to be embedded is adhered in the cavity, and then a dielectric material is laminated to fill the cavity and cover the embedded device. However, in this manufacturing method, the cavity needs to be manufactured first, with a long process flow and a high cost, and it is easy to cause a warping problem during substrate manufacturing. Therefore, there is an urgent need for a new substrate manufacturing method.

SUMMARY

The disclosure aims to solve at least one of the technical problems in the existing technology to some extent.

Therefore, one object of an embodiment of the disclosure is to provide a substrate manufacturing method, an embedded substrate and a semiconductor package, and the method can reduce substrate warping while completing device embedding.

In order to achieve the object above, a technical solution adopted in an embodiment of the disclosure includes a substrate manufacturing method including: manufacturing a first semi-finished substrate, where the first semi-finished substrate includes a plurality of first circuit layers electrically connected with each other and at least one first dielectric layer; the first circuit layers and the first dielectric layer are arranged in a staggered and laminated manner; and a number a of the first circuit layers and a number b of the first dielectric layer satisfy: a=b+1, a≥2; arranging a viscous material layer on the first circuit layer to form a device adhering area, where a projection area of the viscous material layer in a direction perpendicular to the substrate is smaller than a projection area of a device in the direction perpendicular to the substrate; adhering an embedded device on the device adhering area, where a pin face of the embedded device faces away from the viscous material layer; laminating a second dielectric layer on the first circuit layer, where the second dielectric layer covers the viscous material layer and the embedded device; and manufacturing a first conductive pillar, a second conductive pillar and a second circuit layer, where the first conductive pillar extends through the second dielectric layer and is configured for connecting the second circuit layer with the first circuit layer, the second conductive pillar is configured for connecting the embedded device with the second circuit layer.

In addition, the substrate manufacturing method according to the above embodiment in the disclosure may also have the following additional technical features.

Further, in an embodiment of the disclosure, the arranging a viscous material layer on the first circuit layer to form a device adhering area includes: arranging a photo-imagable dielectric (PID) material layer on the first circuit layer or arranging a DAF material layer on the first circuit layer to form the device adhering area.

Further, in an embodiment of the disclosure, the arranging a viscous material layer on the first circuit layer to form a device adhering area includes: arranging a photo-imageable dielectric (PID) material layer on the first circuit layer or arranging a DAF material layer on the first circuit layer to form the device adhering area.

Further, in an embodiment of the disclosure, the manufacturing a first conductive pillar, a second conductive pillar and a second circuit layer includes: drilling the second dielectric layer to form a first through hole and a second through hole, so that the first circuit layer is exposed and a pin of the embedded device is exposed; performing hole filling and electroplating in the first through hole and the second through hole to obtain the first conductive pillar, the second conductive pillar and a second seed layer, where the second seed layer is formed on the second dielectric layer; and performing a photoetching process on the second seed layer to obtain the second circuit layer.

Further, in an embodiment of the disclosure, the arranging a PID material layer on the first circuit layer or arranging a DAF material layer on the first circuit layer includes: laminating the PID material layer on the first circuit layer or coating the DAF material at a preset position of the first circuit layer.

Further, in an embodiment of the disclosure, the manufacturing a first semi-finished substrate includes: laminating an $N^{th}$ dielectric layer on a surface of an $N^{th}$ metal layer, and arranging an $N+1^{th}$ metal layer on the $N^{th}$ dielectric layer; and performing a photoetching process on the $N^{th}$ metal layer, and performing a photoetching process on the $N+1^{th}$ metal layer to form N+1 first circuit layers, where the N+1 first circuit layers are electrically connected with each other through conductive pillars, where N≥1.

In another aspect, an embodiment of the disclosure further provides an embedded substrate, which is prepared by the substrate manufacturing method according to any one of the embodiments above, and includes: the semi-finished substrate, where the semi-finished substrate includes the plurality of first circuit layers electrically connected with each other and the at least one first dielectric layer; the first circuit layers and the first dielectric layer are arranged in the staggered and laminated manner; and the number a of the first circuit layers and the number b of the first dielectric layers satisfy: a=b+1, a≥2; the viscous material layer arranged between the embedded device and the semi-finished substrate; the embedded device, where the pin face of the embedded device is arranged to face away from the first circuit layer of the semi-finished substrate; the second circuit layer connected with the embedded device and the first circuit layer of the semi-finished substrate; and the second dielectric layer arranged between the semi-finished substrate and the second circuit layer, and covering the embedded device.

Further, in an embodiment of the disclosure, the embedded device includes an active device, or a passive device.

Further, in an embodiment of the disclosure, the viscous material layer includes a PID material layer or a DAF material layer.

In addition, the disclosure further provides a semiconductor package, which includes at least one embedded substrate according to any one of the embodiments above.

The advantages and beneficial effects of the disclosure will be given in part in the following description, and will become apparent in part from the following description, or will be learned through the practice of the disclosure.

According to the disclosure, the embedded device may be directly placed in the dielectric layer between the circuit layers, and it is unnecessary to manufacture the cavity to place the embedded device. Moreover, the semi-finished product before embedding the device in the disclosure has a symmetrical structure, so that the warping phenomenon in the manufacturing process can be reduced, and the product yield can be improved.

DETAILED DESCRIPTION

Embodiments of the disclosure are described in detail hereinafter with reference to the drawings to explain the principles and processes of a substrate manufacturing method, an embedded substate, and a semiconductor package in the embodiments of the disclosure.

Figure 1:
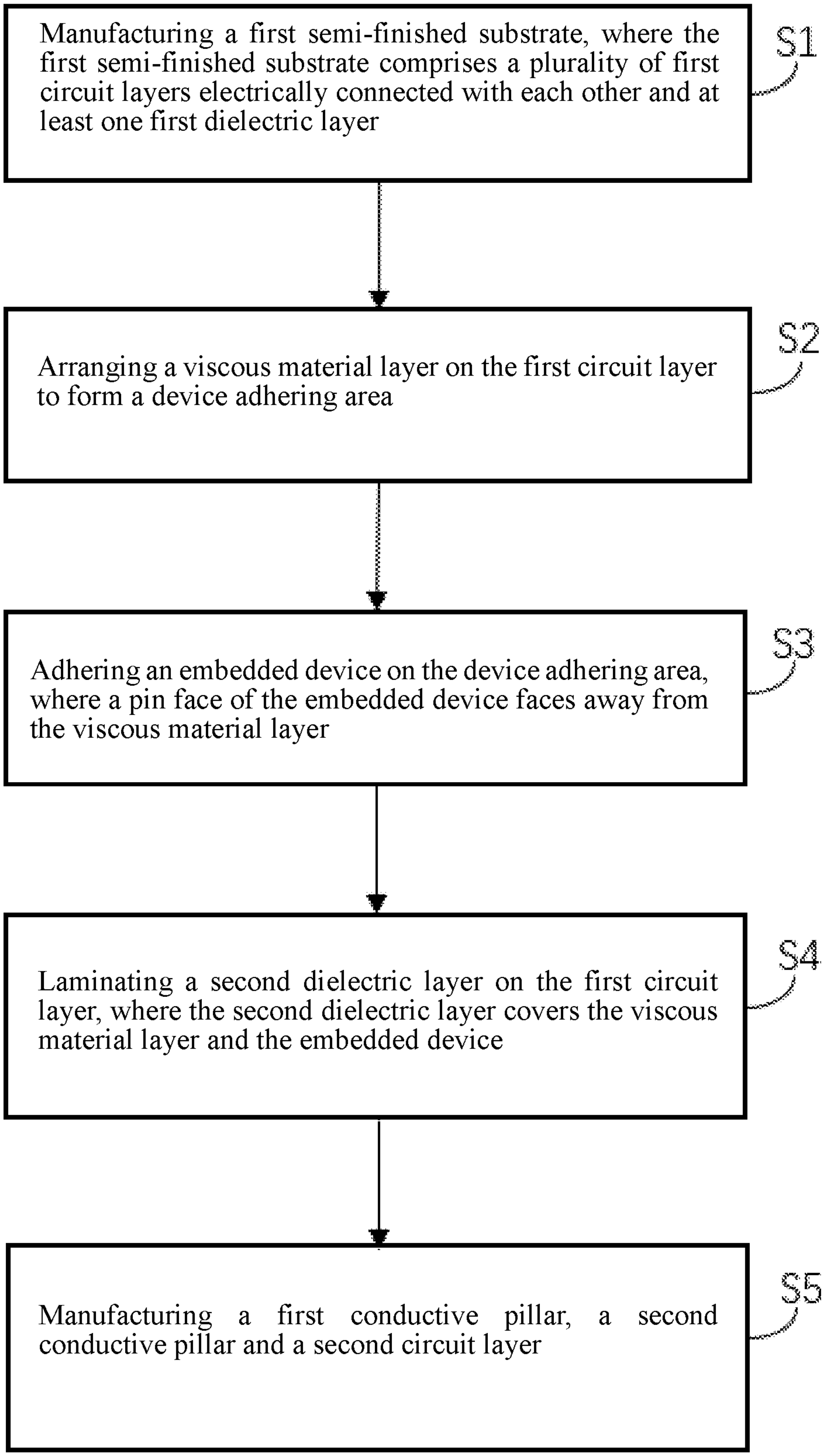
FIG. 1 is a flow chart of a substrate manufacturing method in an embodiment of the disclosure.

With reference to FIG. 1, a substrate manufacturing method of the disclosure includes the following steps.

In S1, a first semi-finished substrate is manufactured, where the first semi-finished substrate includes a plurality of first circuit layers electrically connected with each other and at least one first dielectric layer; the first circuit layers and the first dielectric layer are arranged in a staggered and laminated manner; and a number a of the first circuit layers and a number b of the first dielectric layer satisfy: $a=b+1$, $a\geq 2$.

In this step, the semi-finished substrate may be manufactured in advance, and the semi-finished substrate may include two or more circuit layers and at least one dielectric layer. The first circuit layers and the first dielectric layer may be arranged in the staggered and laminated manner, and the number of the circuit layers is the number of the dielectric layers plus 1, which means that, in a direction perpendicular to the semi-finished substrate, no matter whether the number of the circuit layers in the semi-finished substrate is 2 or N, there is always a circuit layer located on a surface of the semi-finished substrate, and the dielectric layer is always arranged between two circuit layers. By arranging the semi-finished substrate with a symmetrical structure, the warping defect caused by a difference between copper residue rates on two surfaces in a subsequent laminating process can be avoided.

In S2, a viscous material layer is arranged on the first circuit layer to form a device adhering area, where a projection area of the viscous material layer in a direction perpendicular to the substrate is smaller than a projection area of a device in the direction perpendicular to the substrate.

In this step, because the circuit layers are always located on two surfaces of the semi-finished substrate in the direction perpendicular to the substrate, the viscous material layer may be arranged on the circuit layer on any surface, and the projection area of the viscous material layer in the direction perpendicular to the substrate is smaller than the projection area of the device in the direction perpendicular to the substrate, thus forming the device adhering area. In the case that the projection area of the viscous material layer is smaller than the projection area of the device, the viscous material layer may be avoided from overflowing to affect a subsequent process when the device is adhered. The device adhering area may be on any position of the first circuit layer. The viscous material may be configured for fixing an embedded device to avoid the device from shifting in the subsequent process.

In S3, an embedded device is adhered on the device adhering area; and a pin face of the embedded device is arranged to face away from the viscous material layer.

In this step, the embedded device may be adhered on the device adhering area, and the device may include an active or passive device, where the active device may include a chip, a transistor, and the like, and the passive chip may include a resistor, a capacitor, and the like. Because the device has the pin face and a packaging surface, the packaging surface and the pin face of the device are generally arranged opposite to each other, a pin of the device may face away from the first circuit layer during adhering, and the packaging surface is adhered to the viscous material layer. Taking the first circuit layer being upward as an example, the pin of the embedded device should also be upward during adhering.

In S4, a second dielectric layer is laminated on the first circuit layer; and the second dielectric layer covers the viscous material layer and the embedded device.

In this step, after the device is adhered, the second dielectric layer may be laminated on the first circuit layer, and the second dielectric layer may be a dielectric layer made of resin and other materials. The second dielectric layer should completely cover the first dielectric layer, the viscous material layer and the embedded device during laminating, so that a thickness of the second dielectric layer should be greater than a sum of thicknesses of the viscous material layer and the embedded device.

In S5, a first conductive pillar, a second conductive pillar and a second circuit layer are manufactured; the first conductive pillar extends through the second dielectric layer; the first conductive pillar is configured for connecting the second circuit layer and the first circuit layer; and the second conductive pillar is configured for connecting the embedded device with the second circuit layer.

In this step, after laminating the second dielectric layer, the first conductive pillar extending through the second dielectric layer, the second conductive pillar connecting the embedded device and the subsequent circuit layer, and the second circuit layer connecting the semi-finished substrate and the embedded device may be manufactured on the second dielectric layer. During manufacturing, laser drilling may be performed on the second dielectric layer first, then the first conductive pillar and the second conductive pillar are formed by electroplating, a metal layer with a thickness sufficient for manufacturing the second circuit layer is formed by electroplating continuously, and finally, the second circuit layer may be obtained by performing a photoetching process on the metal layer.

Further, the arranging a viscous material layer on the first circuit layer to form the device adhering area may include: arranging a PID material layer on the first circuit layer or arranging a DAF (Die Attach Film) material layer on the first circuit layer to form the device adhering area.

In an embodiment of the disclosure, the viscous material layer may be the PID material layer or the DAF material layer. The PID material layer and the DAF material layer are both a material layer with viscidity, which may be configured for fixing the embedded device to avoid the embedded device from shifting in the subsequent process to affect the product quality. Furthermore, in practical application, the PID material layer is often a thin film covering the whole first circuit layer, therefore when the PID material layer is arranged, it is also necessary to remove areas of the PID layer on the first circuit layer which are not for adhering the device.

Further, the arranging a PID material layer on the first circuit layer may include: arranging the PID material layer on the first circuit layer, where the PID material layer covers the first circuit layer; and performing a photoetching process on the PID material layer to form the device adhering area.

In an embodiment of the disclosure, because the PID material is a thin film sufficient to cover the whole first circuit layer, in order to avoid other areas on the first circuit layer from being electrically isolated by the thin film, it is necessary to remove the PID material layer in a non-device adhering area, and the remaining PID material may be removed by a photoetching process, leaving only the PID material layer in the device adhering area.

Further, the arranging a PID material layer on the first circuit layer or arranging a DAF material layer on the first circuit layer may include: laminating the PID material layer on the first circuit layer or coating the DAF material at a preset position of the first circuit layer.

In an embodiment of the disclosure, the PID material may be arranged on the first circuit layer by laminating, and the DAF material may be arranged at any position of the first circuit layer by coating, thus forming the device adhering area.

Further, the manufacturing a first conductive pillar, a second conductive pillar and a second circuit layer may include:

- S41: drilling the second dielectric layer to form a first through hole and a second through hole, so that the first circuit layer is exposed and a pin of the embedded device is exposed;
- S42: performing hole filling and electroplating in the first through hole and the second through hole to obtain the first conductive pillar, the second conductive pillar and a second seed layer, where the second seed layer is formed on the second dielectric layer; and
- S43: performing a photoetching process on the second seed layer to obtain the second circuit layer.

Specifically, in an embodiment of the disclosure, the second dielectric layer may be drilled first to form a plurality of through holes in the second dielectric layer, the through holes may partially expose the first circuit layer and the pin of the embedded device, and then an electroplating process is performed based on the first circuit layer and the pin of the device. The first conductive pillar extending through the second dielectric layer and the second conductive pillar connecting the subsequent circuit layer and the embedded device are formed in the through holes respectively, then the electroplating is continued until the second seed layer with a thickness sufficient for manufacturing the circuit layer is formed on the second dielectric layer, and finally, the photoetching process is performed on the second seed layer to form the final second circuit layer.

Further, the manufacturing a first semi-finished substrate may include:

- S51: laminating an $N^{th}$ dielectric layer on a surface of an $N^{th}$ metal layer, and arranging an $N+1^{th}$ metal layer on the $N^{th}$ dielectric layer; and
- S52: performing a photoetching process on the $N^{th}$ metal layer, and performing a photoetching process on the N+1 t metal layer to form N+1 first circuit layers, where the N+1 first circuit layers are electrically connected with each other through the conductive pillars, where $N \geq 1$.

In an embodiment of the disclosure, taking the first semi-finished substrate composed of three first circuit layers and two dielectric layers as an example, a first dielectric layer is laminated on a surface of a first metal layer first, a second metal layer is arranged on the first dielectric layer, and then a conductive pillar is arranged to electrically connect the first metal layer with the second metal layer. Subsequently, the first metal layer and the second metal layer are photoetched to form two first circuit layers. Subsequently, a second dielectric layer is laminated on the first circuit layer, a third metal layer is arranged on the second dielectric layer, then a conductive pillar is arranged to electrically connect the first circuit layer with the third metal layer, and finally, the third metal layer is photoetched to form three first circuit layers connected with each other. It should be noted that the number of the circuit layers in the first semi-finished substrate is not limited to two or three, but may also be four or more. When there are more than three circuit layers, one dielectric layer and one metal layer may be laminated on the third circuit layer using the method above, and the metal layer is photoetched to form a new circuit layer.

Figure 2:
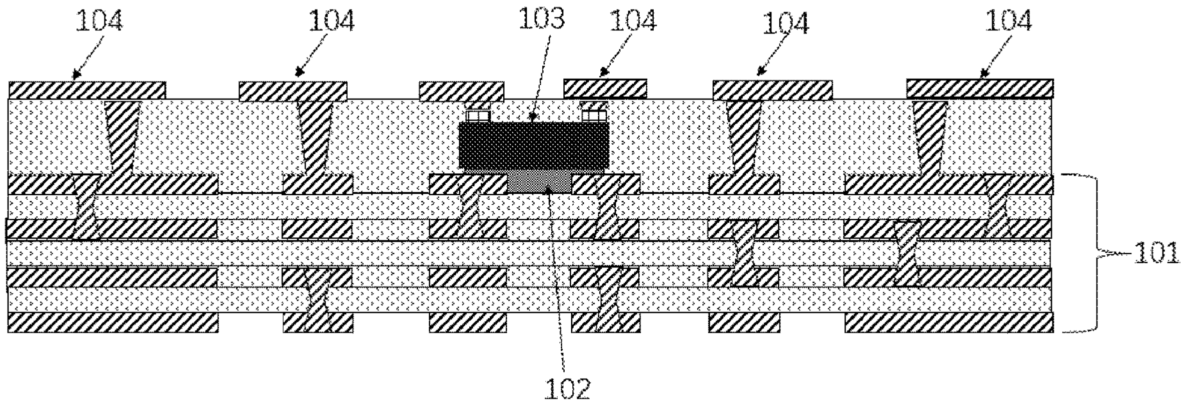
FIG. 2 is a schematic structural diagram of an embedded substrate in an embodiment of the disclosure.

In addition, with reference to FIG. 2, corresponding to the method of FIG. 1, an embodiment of the disclosure further provides a substrate, which may include:

- the semi-finished substrate 101, where the semi-finished substrate 101 may include the plurality of first circuit layers electrically connected with each other and at least one first dielectric layer; and the first circuit layers and the first dielectric layer are arranged in the staggered and laminated manner;
- the viscous material layer 102, which may be arranged between the embedded device and the semi-finished substrate, where the viscous material layer 102 may be configured for fixing the device;
- the embedded device 103, where the pin face of the embedded device may be arranged to face away from the first circuit layer of the semi-finished substrate;
- the second circuit layer 104 which may be connected with the embedded device and the first circuit layer of the semi-finished substrate through the conductive pillar; and
- the second dielectric layer which may be arranged between the semi-finished substrate and the second circuit layer, and completely covers the embedded device.

Further, the embedded device may include an active device, or a passive device. A specifically selected device type may be determined according to a function realized by a specific circuit.

Further, the viscous material layer may include a PID material layer or a DAF material layer. The PID material may completely cover all areas of the first circuit layer during laminating, and a part of the PID layer only used for adhering the device can be obtained after subsequent machining, while the DAF may be coated on the circuit layer, so that fixed-point coating can be realized.

In addition, an embodiment of the disclosure further provides a semiconductor package. The semiconductor package in the embodiment may be obtained by connecting two or more embedded substrates in the embodiment above with each other, or may be obtained by externally connecting a variety of different devices or circuit layer structures based on the embedded substrate in the embodiment above. The semiconductor package can improve warping and product quality, and has a simple structure.

The substrate manufacturing method of the disclosure is described hereinafter with reference to the drawings.

1) Embodiment I

Figure 3:
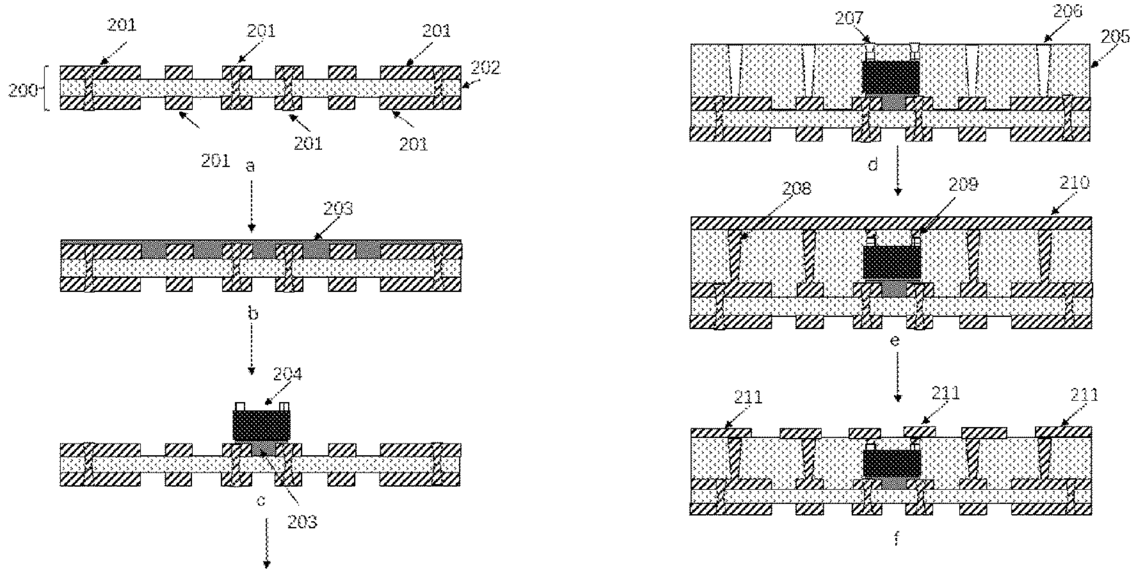
FIG. 3 is a schematic diagram of a structural change in one substrate manufacturing process in an embodiment of the disclosure.

With reference to diagrams a to f in FIG. 3, a semi-finished substrate 200 is provided, which includes two first circuit layers 201 electrically connected with each other and a dielectric layer 202. Symmetrical circuit design in a horizontal direction may avoid the warping defect caused by a difference between copper residue rates of circuits on two surfaces in a manufacturing process. A viscous material layer 203 is arranged on the first circuit layer 201 on any surface of the semi-finished substrate 200. In an embodiment, the viscous material layer 203 is a PID material layer, and a photoetching process is performed on the PID material layer 203, so that the PID material layer covering the first circuit layer 201 remains a part for adhering the device, and a covering area of the remaining part of the PID material is smaller than a back surface of an embedded device 204, thus avoiding the PID material layer from overflowing during adhering to affect the product quality. The embedded device 204 is adhered on the remaining part of the PID material layer, a pin face of the embedded device 204 is upward during adhering, a non-pin face is adhered to the PID material layer 203, then a second dielectric layer 205 is laminated, and the second dielectric layer 205 completely covers one first circuit layer 201, the embedded device 204 and the remaining part of the PID material layer 203. Subsequently, a first through hole 206 and a second through hole 207 are formed in the second dielectric layer 205, and then a first conductive pillar 208 and a second conductive pillar 209 are formed in the first through hole 206 and the second through hole 207 by electroplating. The first conductive pillar 208 may electrically connect the first circuit layer 201 with a subsequent circuit layer, and the second conductive pillar 209 may electrically connect the embedded device 204 with the subsequent circuit layer. After electroplating the conductive pillars, a metal layer 210 may be formed on the second dielectric layer 205 by continuing the electroplating process, and a common photoetching process is performed on the metal layer 210 to obtain a second circuit layer 211.

2) Embodiment II

Figure 4:
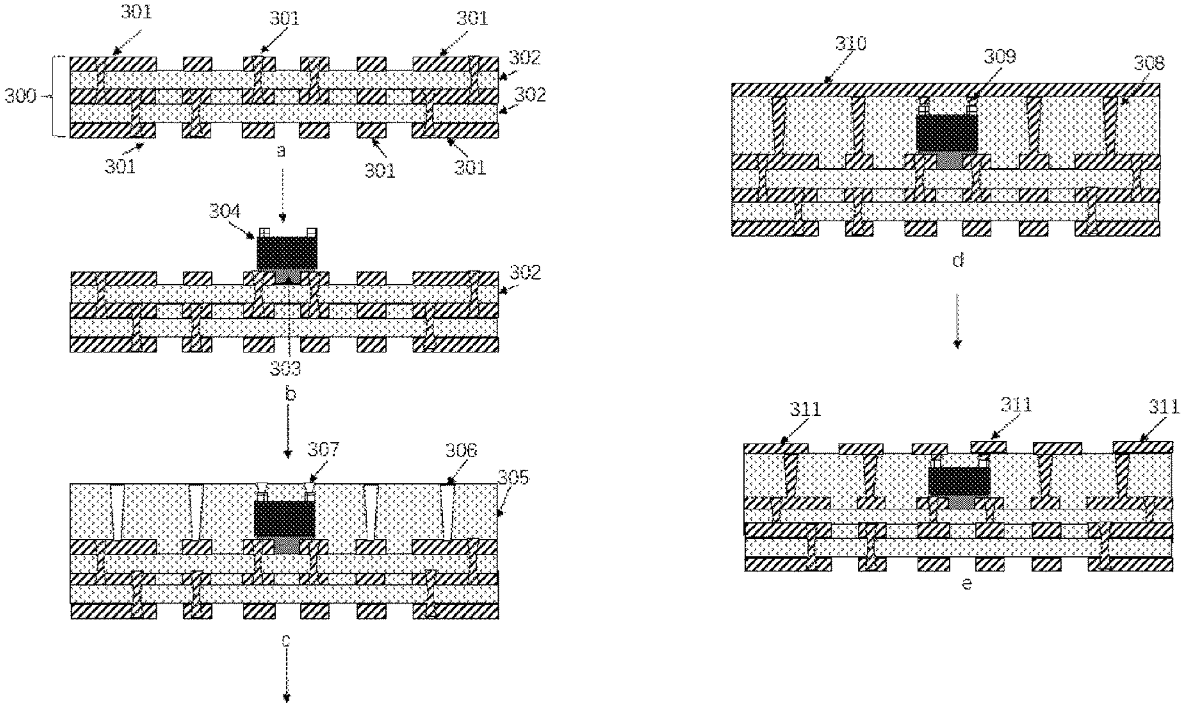
FIG. 4 is a schematic diagram of a structural change in another substrate manufacturing process in an embodiment of the disclosure.

With reference to diagrams a to e in FIG. 4, a semi-finished substrate 300 is provided, which includes three first circuit layers 301 electrically connected with each other and two dielectric layers 302. Symmetrical circuit design in a horizontal direction may avoid the warping defect caused by a difference between copper residue rates of circuits on multiple surfaces in a manufacturing process. A DAF material layer 303 is coated on the first circuit layer 301 on any surface of the semi-finished substrate 300, and then an embedded device 304 is adhered on the DAF material layer 303. A pin face of the embedded device 304 is upward during adhering, a non-pin face is adhered to the DAF material layer 303, then a second dielectric layer 305 is laminated, and the second dielectric layer 305 completely covers one first circuit layer 301, the embedded device 304 and the DAF material layer 303. The DAF material layer 303 is smaller than a projection area of the embedded device 304 in a vertical direction, thus avoiding the DAF material layer 303 from overflowing during adhering to affect the product quality. Subsequently, a first through hole 306 and a second through hole 307 are manufactured in the second dielectric layer 305, and then a first conductive pillar 308 and a second conductive pillar 309 are formed in the first through hole 306 and the second through hole 307 by electroplating. The first conductive pillar 308 may electrically connect the first circuit layer 301 with a subsequent circuit layer, and the second conductive pillar 309 may electrically connect the embedded device 304 with the subsequent circuit layer. After electroplating the conductive pillars, a metal layer 310 may be formed on the second dielectric layer 305 by continuing the electroplating, and a common photoetching process is performed on the metal layer 310 to obtain a second circuit layer 311.

All the contents in the above method embodiments are applicable to the apparatus embodiments, the specific functions realized by the apparatus embodiments are the same as those realized by the method embodiments above, and the beneficial effects achieved by the apparatus embodiments are the same as those achieved by the method embodiments above.

In the foregoing description, the explanation with reference to the terms "an implementation/embodiment", "another implementation/embodiment" or "some implementations/embodiments", etc. means that specific features, structures, materials or characteristics described in connection with the embodiment(s) or example(s) are included in at least one embodiment or example of the present disclosure. In the description, the illustrative expressions of the above-mentioned terms do not necessarily refer to the same embodiments or examples. Moreover, the specific features, structures, materials or characteristics described can be combined in any one or more embodiments or examples in any suitable manner.

Although the embodiments of the present disclosure have been shown and described, it can be understood by those of ordinary skill in the art that various changes, modifications, substitutions and variations may be made to these embodiments without departing from the principles and objectives of the present disclosure, and the scope of the present disclosure is defined by the claims and their equivalents.

The above is a detailed description of the preferred implementation of the present disclosure, but the present disclosure is not limited to the embodiments described above. Those of ordinary skill in the art can also make various equivalent modifications or replacements without departing from the gist of the present disclosure, and these equivalent modifications or replacements are all included in the scope defined by the claims of the present disclosure.

What is claimed is:

1. A substrate manufacturing method, comprising:

manufacturing a first semi-finished substrate, wherein the first semi-finished substrate comprises a plurality of first circuit layers electrically connected with each other and at least one first dielectric layer; the first circuit layers and the first dielectric layer are arranged in a staggered and laminated manner; and a number a of the first circuit layers and a number b of the first dielectric layer satisfy: a=b+1, a≥2;

arranging a viscous material layer on the first circuit layer to form a device adhering area, wherein a projection length defined by a first left side and a first right side of the viscous material layer in a direction perpendicular to the substrate is smaller than a projection length defined by a second left side and a second right side of a device in the direction perpendicular to the substrate, and the viscous material layer comprises a bottom surface that is flush with a bottom surface of the first circuit layer and has a height smaller than a height of the first circuit layer;

adhering an embedded device on the device adhering area, wherein a pin face of the embedded device faces away from the viscous material layer;

laminating a second dielectric layer on the first circuit layer, wherein the second dielectric layer covers the viscous material layer and the embedded device; and manufacturing a first conductive pillar, a second conductive pillar and a second circuit layer, wherein the first conductive pillar extends through the second dielectric layer and is configured for connecting the second circuit layer with the first circuit layer, the second conductive pillar is configured for connecting the embedded device with the second circuit layer.

2. The substrate manufacturing method according to claim 1, wherein the manufacturing the first conductive pillar, the second conductive pillar and the second circuit layer comprises:

drilling the second dielectric layer to form a first through hole and a second through hole, so that the first circuit layer is exposed and a pin of the embedded device is exposed;

performing hole filling and electroplating in the first through hole and the second through hole to obtain the first conductive pillar, the second conductive pillar and a second seed layer, wherein the second seed layer is formed on the second dielectric layer; and performing a photoetching process on the second seed layer to obtain the second circuit layer.

3. The substrate manufacturing method according to claim 1, wherein the manufacturing the first semi-finished substrate comprises:

laminating an $N^{th}$ dielectric layer on a surface of an $N^{th}$ metal layer, and arranging an $N+1^{th}$ metal layer on the $N^{th}$ dielectric layer; and performing a photoetching process on the $N^{th}$ metal layer, and performing a photoetching process on the $N+1^{th}$ metal layer to form N+1 first circuit layers, wherein the N+1 first circuit layers are electrically connected with each other through conductive pillars, wherein N≥1.

4. The substrate manufacturing method according to claim 1, wherein the arranging the viscous material layer on the first circuit layer to form the device adhering area comprises:

arranging a photo-imageable dielectric (PID) material layer on the first circuit layer or arranging a Die Attach Film (DAF) material layer on the first circuit layer to form the device adhering area.

5. The substrate manufacturing method according to claim 4, wherein the arranging the PID material layer on the first circuit layer, comprises:

arranging the PID material layer on the first circuit layer, wherein the PID material layer covers the first circuit layer; and performing a photoetching process on the PID material layer to form the device adhering area.

6. The substrate manufacturing method according to claim 4, wherein the arranging the PID material layer on the first circuit layer or arranging the DAF material layer on the first circuit layer comprises: laminating the PID material layer on the first circuit layer or coating the DAF material at a preset position of the first circuit layer.

7. An embedded substrate, prepared by the substrate manufacturing method according to claim 1, and comprising:

the semi-finished substrate, wherein the semi-finished substrate comprises the plurality of first circuit layers electrically connected with each other and the at least one first dielectric layer;

the first circuit layers and the first dielectric layer are arranged in the staggered and laminated manner; and the number a of the first circuit layers and the number b of the first dielectric layers satisfy: a=b+1, a≥2;

the viscous material layer arranged between the embedded device and the semi-finished substrate;

the embedded device, wherein the pin face of the embedded device is arranged to face away from the first circuit layer of the semi-finished substrate;

the second circuit layer connected with the embedded device and the first circuit layer of the semi-finished substrate; and the second dielectric layer arranged between the semi-finished substrate and the second circuit layer, and covering the embedded device, wherein a projection length defined by a first left side and a first right side of the viscous material layer in a direction perpendicular to the substrate is smaller than a projection length defined by a second left side and a second right side of a device in the direction perpendicular to the substrate, and the viscous material layer comprises a bottom surface that is flush with a bottom surface of the first circuit layer and has a height smaller than a height of the first circuit layer.

8. The embedded substrate according to claim 7, wherein the embedded device comprises an active device, or a passive device.

9. The embedded substrate according to claim 7, wherein the viscous material layer comprises a photo-imageable dielectric (PID) material layer or a Die Attach Film (DAF) material layer.

10. A semiconductor package, comprising at least one embedded substrate according to claim 7.

* * * * *